(12) United States Patent
Kageyama

(10) Patent No.: US 9,876,144 B2
(45) Date of Patent: *Jan. 23, 2018

(54) LIGHT-EMITTING ELEMENT

(71) Applicant: NICHIA CORPORATION, Anan-shi, Tokushima (JP)

(72) Inventor: Hiroaki Kageyama, Tokushima (JP)

(73) Assignee: NICHIA CORPORATION, Anan-Shi (JP)

(*) Notice: Subject to any disclaimer, the term of this patent is extended or adjusted under 35 U.S.C. 154(b) by 78 days.

This patent is subject to a terminal disclaimer.

(21) Appl. No.: 15/160,526

(22) Filed: May 20, 2016

(65) Prior Publication Data

US 2016/0343926 A1    Nov. 24, 2016

(30) Foreign Application Priority Data

May 22, 2015  (JP) ................. 2015-104139
Apr. 4, 2016  (JP) ................. 2016-075007

(51) Int. Cl.
*H01L 33/38*  (2010.01)
*H01L 33/06*  (2010.01)

(52) U.S. Cl.
CPC .................... *H01L 33/38* (2013.01)

(58) Field of Classification Search
CPC .................................................. H01L 33/385
See application file for complete search history.

(56) References Cited

U.S. PATENT DOCUMENTS

2012/0248405 A1* 10/2012 Tu ................ H01L 33/44
257/13

FOREIGN PATENT DOCUMENTS

| JP | H11-150300 A | 6/1999 |
| JP | 2008-108905 A | 5/2008 |
| JP | 2011-071339 A | 4/2011 |

* cited by examiner

*Primary Examiner* — Caleb Henry
*Assistant Examiner* — Mounir Amer
(74) *Attorney, Agent, or Firm* — Foley & Lardner LLP

(57) ABSTRACT

A light-emitting element includes a semiconductor layered body comprising: an n-type semiconductor layer, and p-type semiconductor layer; an insulating film disposed on the semiconductor layered body and defining at least one p-side opening above the p-type semiconductor layer and a plurality of n-side openings exposing the n-type semiconductor layer; an n-side electrode disposed on the insulating film and comprising a plurality of first n-contact portions each electrically connected to the n-type semiconductor layer through one of the plurality of n-side openings; a p-side electrode electrically connected to the p-type semiconductor layer through the at least one p-side opening; a p-side post electrode disposed on the p-side electrode; and an n-side post electrode disposed on the n-side electrode. A total area of one or more first n-contact portions located on the second side is smaller than a total area of one or more first n-contact portion located on the first side.

20 Claims, 8 Drawing Sheets

LIGHT-EMITTING ELEMENT

CROSS-REFERENCE TO RELATED APPLICATIONS

The present application claims priority to Japan Patent Application Nos. 2015-104139 filed May 22, 2015, and 2016-075007 filed Apr. 4, 2016, both of which are incorporated herein by reference in their entireties.

BACKGROUND

The present disclosure relates to a light-emitting element.

Conventionally, with respect to light-emitting elements in which flip-chips packaging is used, there have been proposed light-emitting elements in which a p-type semiconductor layer is provided on an n-type semiconductor layer, an insulating film that includes an opening is provided on the p-type semiconductor layer, and an n-side electrode is provided on the insulating film so as to extend in the opening of an insulation layer and to be brought into contact with the n-type semiconductor layer, thereby conducting electricity (see Japanese Unexamined Patent Application Publication No. 2011-071339).

SUMMARY

It is an object of certain embodiments of the present invention to provide a light-emitting element that can improve intensity distribution of light emission in the surface of the light-emitting element.

In order to achieve the aforementioned object, a light-emitting element according to certain embodiments of the present invention includes a semiconductor layered body, an insulating film, an n-side electrode, and a p-side electrode, a p-side post electrode, and an n-side post electrode. The semiconductor layered body has a polygonal shape in a plan view, and includes an n-type semiconductor layer, and a p-type semiconductor layer disposed on the n-type semiconductor layer except a portion. The insulating film is disposed on the semiconductor layered body and defines at least one p-side opening above the p-type semiconductor layer and a plurality of n-side openings exposing the n-type semiconductor layer. The n-side electrode is disposed on the insulating film and includes a plurality of first n-contact portions each electrically connected to the n-type semiconductor layer through one of the plurality of n-side openings. The p-side electrode is electrically connected to the p-type semiconductor layer through the at least one p-side opening. The first n-contact portion and the p-side post electrode disposed on the p-side electrode are arranged on a first side of the semiconductor layered body in the plan view, and the first n-contact portions and an n-side post electrode disposed on the n-side electrode are arranged on a second edge side opposite to the first edge side. A total area of the first n-contact portions arranged on the second side is smaller than a total area of the first n-contact portions arranged on the first edge side.

According to the light-emitting element of certain embodiments of the present invention, the intensity distribution of light emission in the surface of the light-emitting element can be improved.

DETAILED DESCRIPTION

Figure 1:
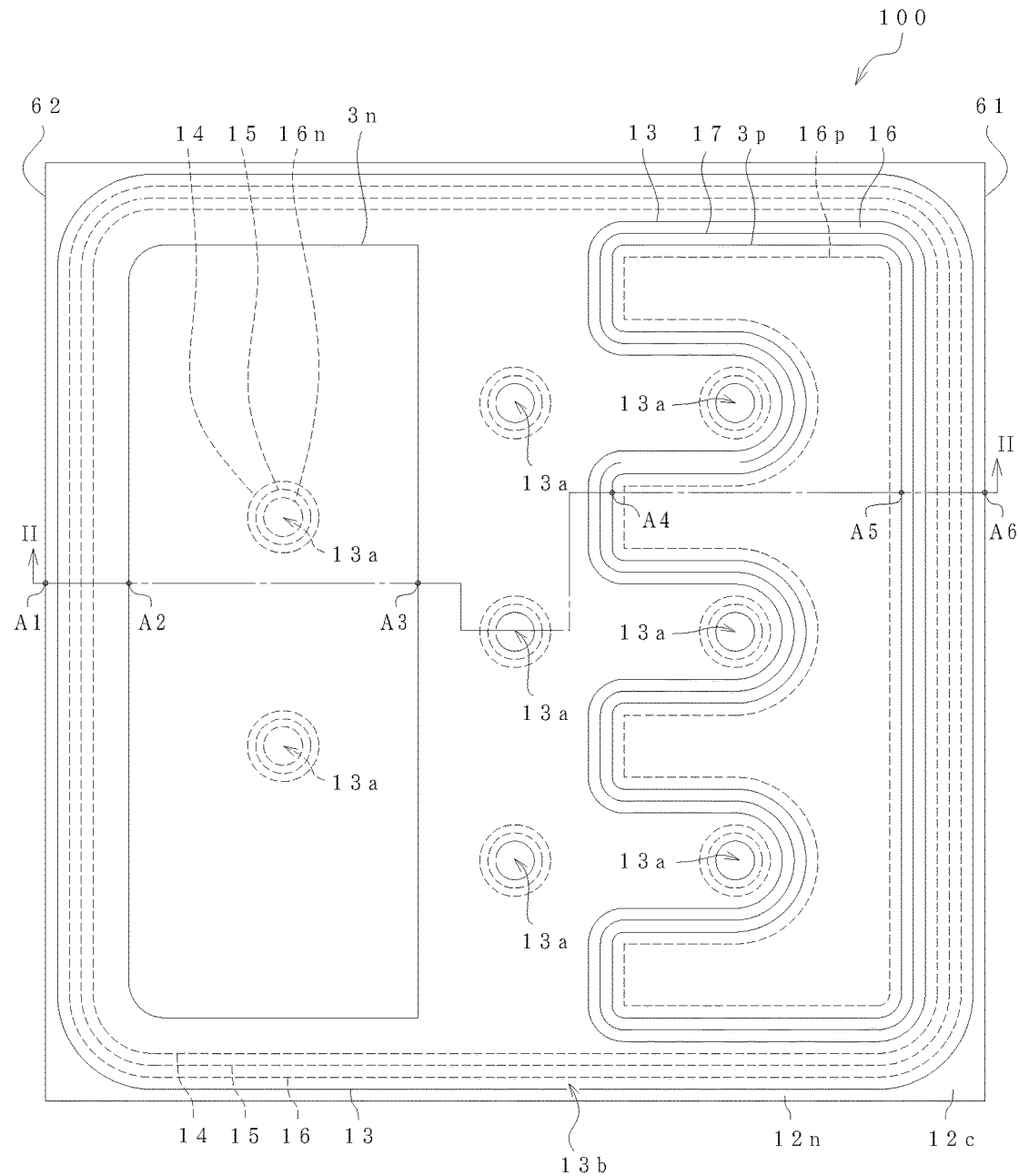
FIG. 1 is a plan view schematically illustrating the configuration of a light-emitting element according to a first embodiment of the present invention.

Hereinafter, a light-emitting element according to embodiments of the present invention will be described. It is noted that the drawings referred in the following descriptions schematically represent embodiments of present invention. Accordingly, the scales, intervals, and positional relationships of respective members may be exaggerated, or illustration of parts of the elements may be omitted. Also, the scales or intervals of respective members may not corresponded between a plan view and its corresponding cross-sectional view. Also, in the description below, in principle, the same term or reference number represents the same element, and therefore its detailed description may be appropriately omitted.

In the present application, the terms "up", "down", "right", and "left" may be replaced in accordance with the circumstances. For example, the terms "up" and "down" denote relative locational relationships between the components in the drawings that are referred to for the purpose of explanation, but do not intend to denote an absolute position unless specifically stated otherwise.

First Embodiment

Configuration of Light-Emitting Element

Figure 2:
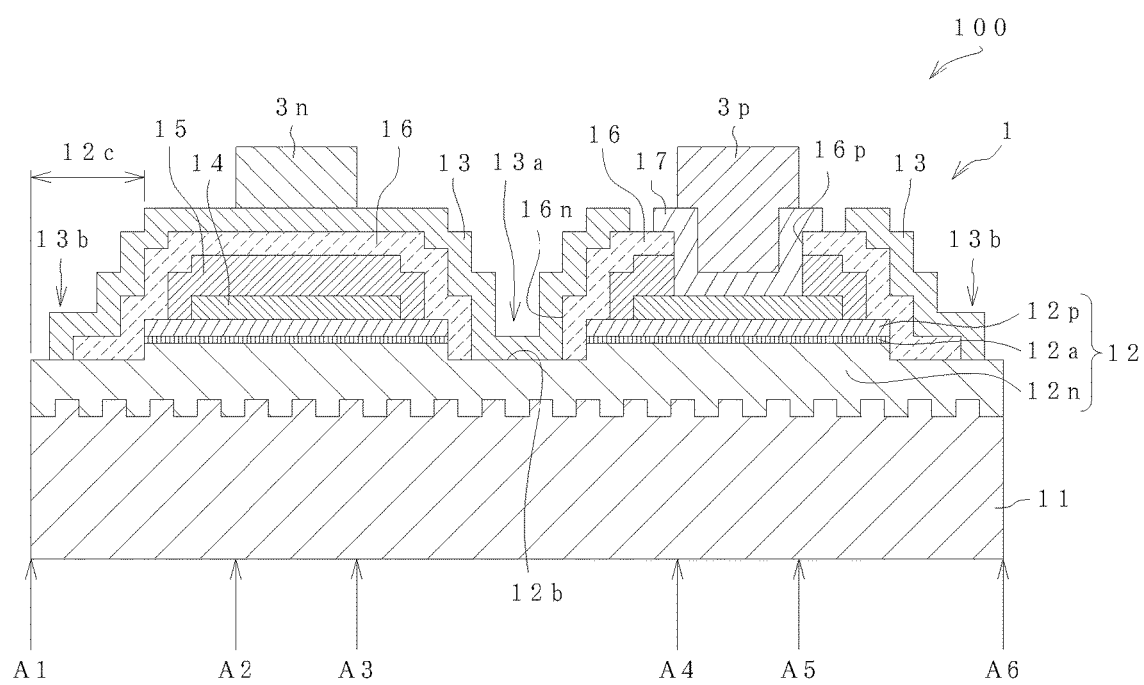
FIG. 2 is a schematic cross-sectional view taken along a line II-II in FIG. 1.

First, the configuration of a light-emitting element of a first embodiment of the present invention will be described referring to FIGS. 1 to 7. The cross-sectional view shown in FIG. 2 schematically represents a cross section taken along the line II-II of the plan view in FIG. 1. Positions A1 to A6 on line II-II shown in FIG. 1 correspond to positions A1 to A6 shown by arrows in FIG. 2, but in order to facilitate easy understanding of the cross-sectional structure, relative distances (lengths of members) in the plan view in FIG. 1 are appropriately extended or shortened in the cross-sectional view in FIG. 2 so that the relative distances in FIG. 1 do not coincide with the relative distances in FIG. 2. Unless otherwise specified, in a similar manner as in FIG. 2, other cross-sectional views illustrated below are cross-sections corresponding to line II-II in the plan view in FIG. 1. In FIGS. 3 to 7, an arrangement region in a plan view is shown by hatching for each layer for explaining the stacked-layer structure of a light emitting device 100 according to the present embodiment.

The configuration of each portion of the light-emitting element 100 will be sequentially described referring to FIGS. 1 to 7.

The light-emitting element 100 includes a substrate 11, a semiconductor layered body 12, a whole surface electrode 14, a cover electrode 15, an insulating film 16, an n-side electrode 13, a p-side electrode 17, an n-side post electrode 3n, and a p-side post electrode 3p. In the light-emitting element 100, the upper surfaces of the n-side post electrode 3n and the p-side post electrode 3p are provided as mounting surfaces for electrically connecting to the outside. Also, the lower surface side of the light-emitting element 100 mainly acts as a light extraction surface from which light is extracted. The light emitting element 100 is formed at a wafer level as described in detail below.

Substrate 11

A substrate 11 may be of any appropriate material that allows for epitaxial growth of a semiconductor thereon, and any appropriate dimensions can be employed. Examples of such substrate material include an insulating substrate such as a sapphire with a principal plane being C-plane, R-plane, or A-plane, and a spinel ($MgAl_2O_4$); and silicon carbide (SiC), silicon, ZnS, ZnO, GaAs, and diamond, and an oxide substrate such as lithium niobate and neodymium gallate that can form a lattice match with a semiconductor. In the present embodiment, it is preferable that a light-transmissive sapphire substrate be employed in view of improving a light extracting efficiency of the light-emitting element 100.

Semiconductor Layered Body 12

The semiconductor layered body 12 is a multilayered body layered on the substrate 11 and includes an n-type semiconductor layer 12n, an active layer 12a, and a p-type semiconductor layer 12p in this order from the substrate 11 side. The p-type semiconductor layer 12p is disposed on a portion of the n-type semiconductor layer 12n. For the n-type semiconductor layer 12n, the active layer 12a, and the p-type semiconductor layer 12p, semiconductors such as $In_XAl_YGa_{1-X-Y}N$ ($0 \leq X$, $0 \leq Y$, $X+Y \leq 1$) are preferably used. Each of those semiconductor layers may have a single layer structure or may have a layered structure or a super lattice structure with layers having different compositions, thicknesses, etc. In particular, the active layer 12a is preferably of a single quantum well structure or multiple quantum well structure in which thin layers each can exhibit quantum effects are layered.

It is preferable that the semiconductor layered body 12 be formed in a polygonal shape in a plan view, for example, formed in a rectangular or hexagonal shape. In the present embodiment, the semiconductor layered body 12 is formed in an approximately rectangular shape. The semiconductor layered body 12 may have any appropriate dimensions, in the case where the semiconductor layered body 12 is formed in an approximately square shape in a plan view, one side thereof can be, for example, in a range of 300 to 3000 μm, preferably in a range of 500 to 1500 μm.

As shown in FIG. 2, the semiconductor layered body 12 defines holes 12b. Also, the semiconductor layered body 12 may include a peripheral edge portion 12c. The holes 12b of the semiconductor layered body 12 are provided in a region at interior to the peripheral edge portion 12c. A plurality of holes 12b (see FIGS. 5 and 6) are provided in the light-emitting element 100.

In the holes 12b of the semiconductor layered body 12, the p-type semiconductor layer 12p, the active layer 12a, and a part of the n-type semiconductor layer 12n are removed from the top of the n-type semiconductor layer 12n. The bottom surface of the holes 12b is defined by an exposed surface of the n-type semiconductor layer 12n. The lateral surfaces of the holes 12b are covered by an insulating film 16. The bottom surface of each of the holes 12b is partially covered by the insulating film 16 in the form of a circular ring, and the n-side electrode 13 is disposed in the circular ring. That is, the n-side electrode 13 and the n-type semiconductor layer 12n are in contact with each other and electrically connected to each other through an n-side opening 16n of the insulating film 16 disposed on a part of the bottom surface of each of the holes 12b. The holes 12b may be formed in, for example, a circular shape or an elliptic shape in top view.

The peripheral edge portion 12c of the semiconductor layered body 12 is a residual portion of a cutting margin for singulating the light emitting elements 1 in a wafer state, disposed along boundary lines of the light emitting elements 1 in a wafer state. In the peripheral edge portion 12c, the p-type semiconductor layer 12p and the active layer 12a are not disposed, and the n-type semiconductor layer 12n is exposed. Accordingly, hereinafter, the peripheral edge portion 12c of the semiconductor layered body 12 may also be referred to as the peripheral edge portion 12c of the n-type semiconductor layer 12n. In the light emitting element 100, the lateral side surfaces of the p-type semiconductor layer 12p and the active layer 12a that are exposed after forming the peripheral edge portion 12c of the semiconductor layered body 12 are covered by the insulating film 16. The peripheral edge portion 12c of the semiconductor layered body 12 is covered by the n-side electrode 13 and the insulating film 16, but is partially exposed.

As shown in FIG. 2, the boundary between the peripheral edge portion 12c of the n-type semiconductor layer 12n and the p-type semiconductor layer 12p is covered by the n-side electrode 13 and the insulating film 16 and is not covered by the cover electrode 15. This indicates that in a plan view in FIG. 1, a boundary line between the peripheral edge portion 12c and the p-type semiconductor layer 12p exists between a line showing the peripheral edge of the cover electrode 15 and a line showing the peripheral edge of the insulating film 16 in the vicinity of each side of the rectangular semiconductor layered body 12, but in FIG. 1, the boundary line is omitted for improving the visibility of other lines of the site. Also, in other plan views, the boundary line between the peripheral edge portion 12c and the p-type semiconductor layer 12p exists between the line showing the peripheral edge of the cover electrode 15 and the line showing the peripheral edge of the insulating film 16, but illustration of the boundary line is omitted.

In the case where the shape of the hole 12b of the semiconductor layered body 12, which is viewed from an upper surface, is a circle, the diameter of the hole 12b can be appropriately set in accordance with the size of the semiconductor layered body 12. With a smaller diameter of the hole 12b, the region where the active layer 12a etc. is partially removed can be reduced, so that the light emitting region of the light emitting element 100 can be increased. With a larger diameter of the hole 12b, the contact area between the n-side electrode 13 and the n-type semiconductor layer 12n can be increased, so that an increase in forward voltage Vf can be reduced. The lower limit of the diameter of the hole 12b can be set to the extent that the hole 12b can be manufactured by etching with high accuracy. The upper limit of the diameter of the hole 12b may be set in such a manner that desired light emission can be maintained even when the active layer 12a etc. is partially removed to form the hole 12b. One example of the diameter may be, for example, in a range of 5 to 150 μm, preferably in a range of 20 to 100 µm. Also, in the peripheral edge portion 12c of the semiconductor layered body 12, the width of an area exposed from the n-side electrode 13 corresponds to a half value of the width of dicing streets at the time of singulating the light emitting devices from a wafer, and can be appropriately set according to the size of the semiconductor layered body 12. In the peripheral edge portion 12c of the semiconductor layered body 12, the width of the region exposed from the n-side electrode 13 can be set, for example, in a range of 10 to 150 µm, preferably in a range of 20 to 100 µm.

Whole-Surface Electrode 14

Figure 3:
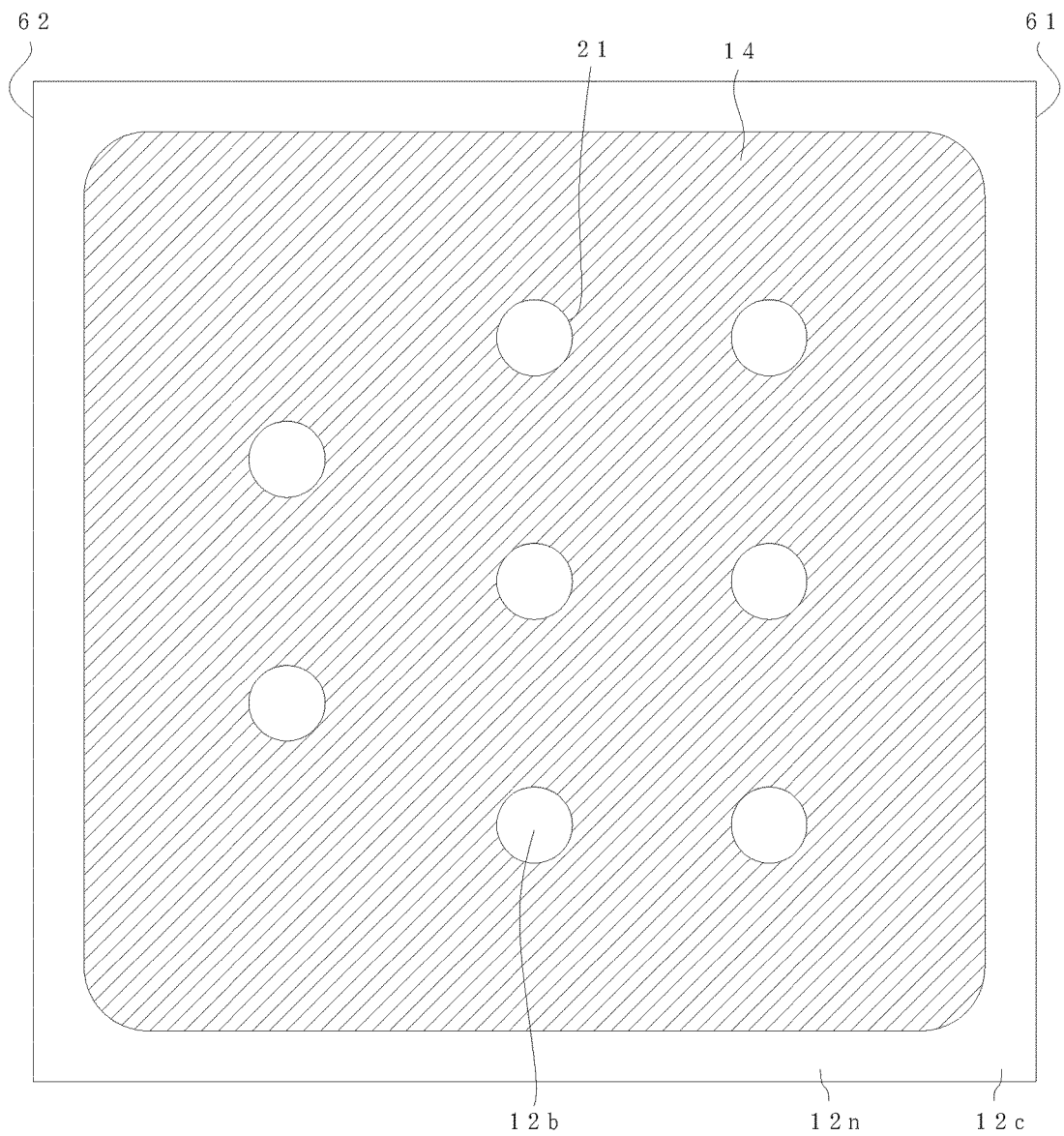
FIG. 3 is an explanatory view schematically illustrating the arrangement area of a whole surface electrode of the light-emitting element in FIG. 1.

As illustrated in FIGS. 2 and 3, the whole-surface electrode 14 is disposed so as to cover an approximately entire upper surface of the p-type semiconductor layer 12p. It is noted that the expression "approximately entire upper surface of the p-type semiconductor layer" in the present specification includes a case in which the whole-surface electrode 14 is disposed on the entire upper surface of the p-type semiconductor layer 12p, a case in which a gap is included to the extent that the characteristics of the light-emitting element of the p-type semiconductor layer 12p are not reduced. In FIG. 3, an area represented by the hatching is an area on which the entire surface electrode 14 is provided in the end. The whole-surface electrode 14 defines a total of eight openings 21 at positions corresponding to the areas of the n-type semiconductor layer 12n where the holes 12b to be defined.

The entire surface electrode 14 is a layer for diffusing a current, which is supplied through the p-side electrode 17, to the whole surface of the p-type semiconductor layer 12p. The whole-surface electrode 14 has high light reflectivity, and also serves as a layer where the light emitted by the light emitting element 100 is reflected downward to a light extraction surface.

For the whole-surface electrode 14, a metal material having good electrical conductivity and light reflectivity can be used. As the metal materials having good light reflectivity, particularly in the visible region, Ag, Al, Ni, Ti, Pt, or an alloy mainly composed of any of these metals can be used. For the whole-surface electrode 14, a single layer or a multi-layer of these metal materials can be used.

Cover Electrode 15

Figure 4:
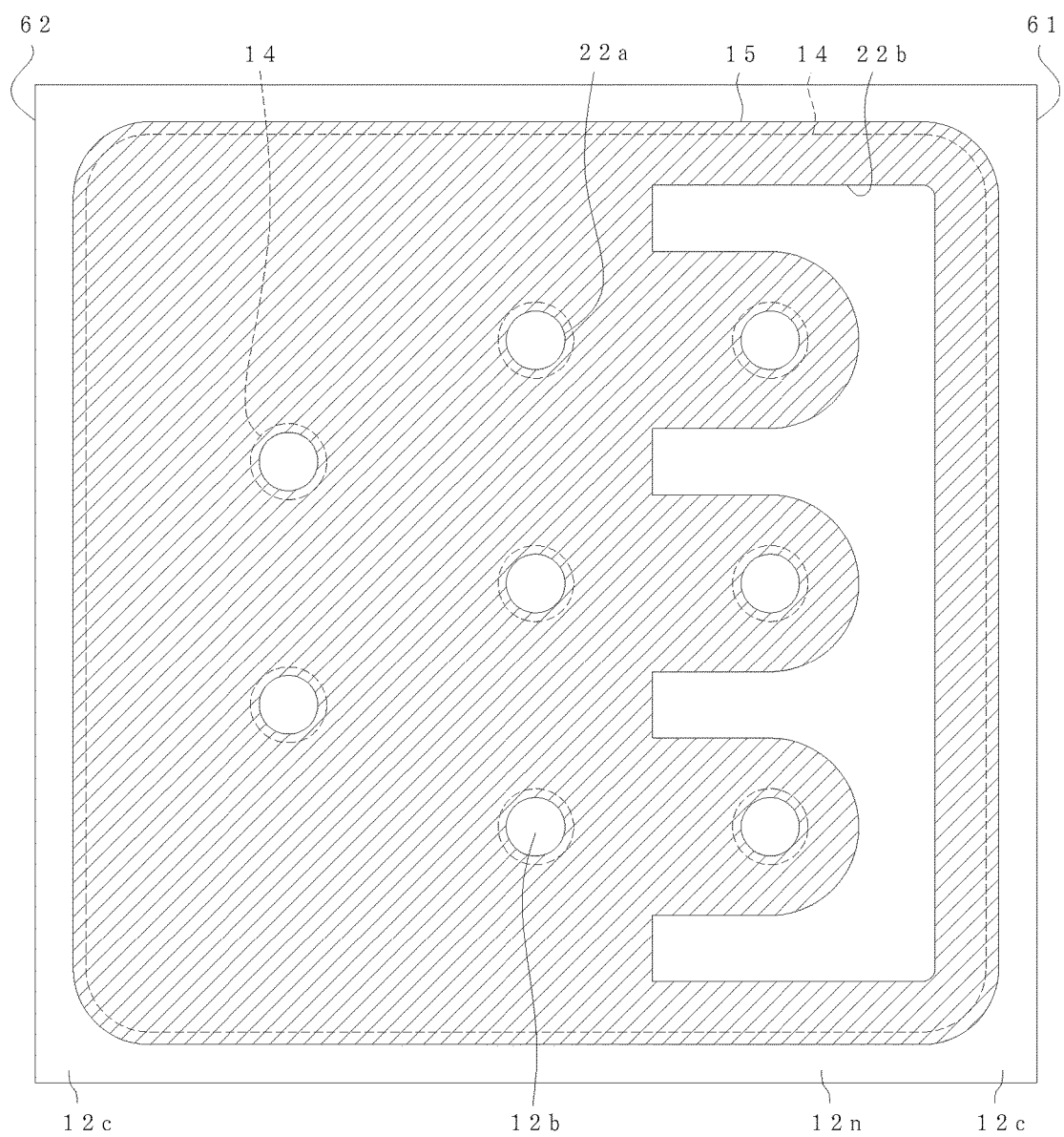
FIG. 4 is an explanatory view schematically illustrating the arrangement area of a cover electrode of the light-emitting element in FIG. 1.

As shown in FIG. 2 and FIG. 4, the cover electrode 15 is disposed to cover the lateral side surfaces and a portion of the upper surface of the whole-surface electrode 14. In FIG. 4, the hatched area shows a finished shape of the cover electrode 15. The cover electrode 15 defines a total of eight openings 22a at positions corresponding to the holes 12b of the n-type semiconductor layer 12n, and an opening 22b formed at a position corresponding to the p-side electrode 17. The p-side electrode 17 is disposed in the opening 22b defined in the cover electrode 15 and a p-side opening 16p defined in the insulating film 16, and is in contact with the whole-surface electrode 14, and thus electrically connected to the whole-surface electrode 14.

In FIG. 4, for descriptive purposes, the edges of the cover electrode 15 and the edges of the p-type semiconductor layer 12p (that is, the opening edges of the holes 12b and the peripheral edges of the peripheral edge portion 12c) are shown overlapping each other, but the p-type semiconductor layer 12p may be left with a wider area than the cover electrode 15.

The cover electrode 15 is formed to reduce the migration of the metal material that forms the whole-surface electrode 14. For the cover electrode 15, a metal oxide or metal nitride having a barrier property can be used. For example, an oxide or nitride of at least one selected from the group consisting of Si, Ti, Zr, Nb, Ta and Al can be used. For the cover electrode 15, a single layer or a stacked layer of these metal materials can be used. The cover electrode 15 is disposed at slightly inner side than the p-type semiconductor layer 12p. In the present embodiment, SiN having insulation properties is used for the cover electrode 15.

Insulating Film 16

The insulating film 16 is an interlayer insulating film which is disposed over the semiconductor layered body 12, and serves as a protective film and antistatic film for the light emitting element 1. For the insulating film 16, a metal oxide or metal nitride can be used. For example, an oxide or nitride of at least one selected from the group consisting of Si, Ti, Zr, Nb, Ta and Al can be preferably used. Also, as the insulating film 16, two or more light-transmissive dielectric materials having different refractive indexes may be layered to form a Distributed Bragg Reflector (DBR) film.

Figure 5:
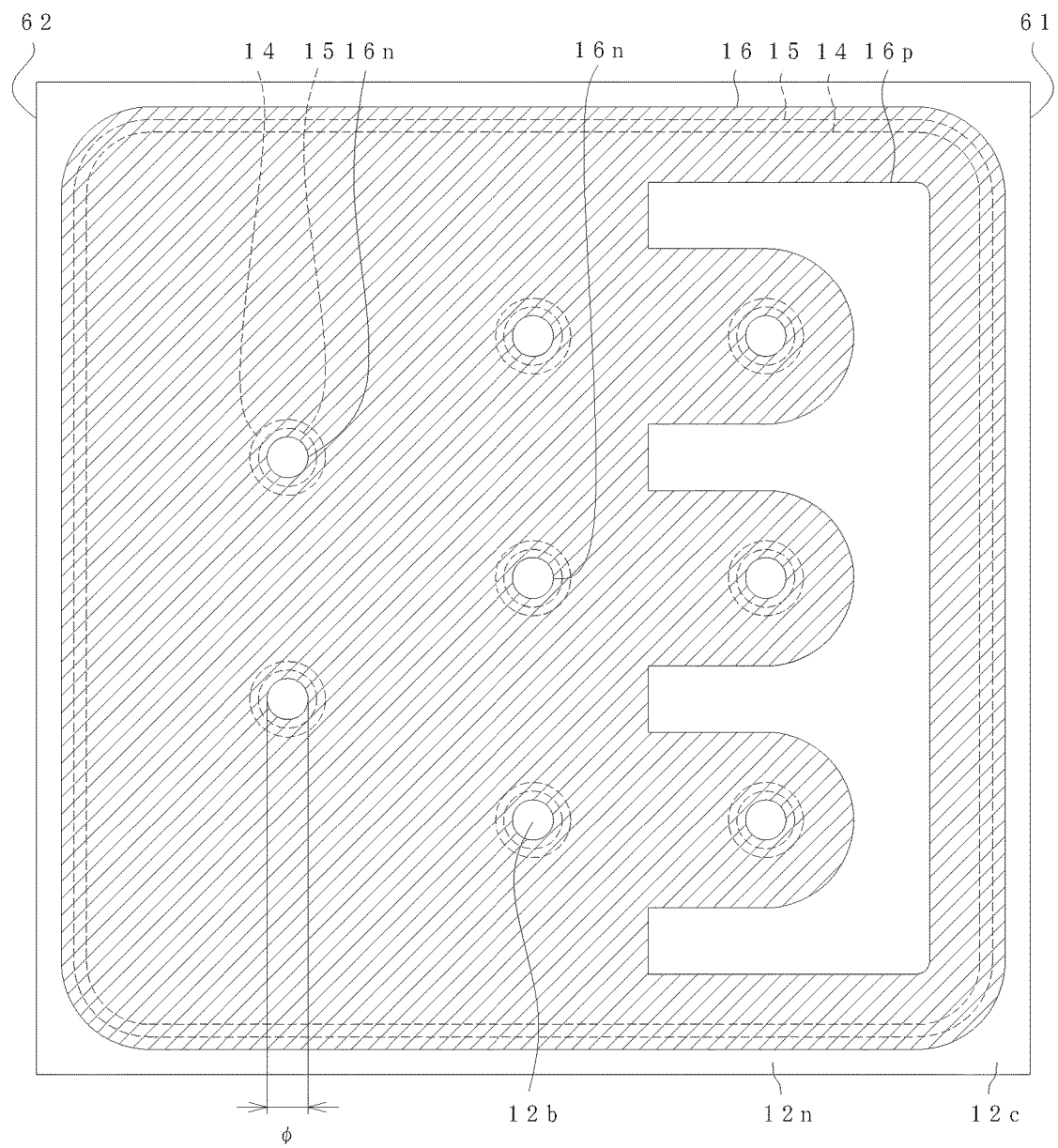
FIG. 5 is an explanatory view schematically illustrating the arrangement area of an insulating film of the light-emitting element in FIG. 1.

As shown in FIG. 2 and FIG. 5, the insulating film 16 is disposed on the lateral side surfaces and a portion of the upper surface of the cover electrode 15 and on the upper surface and the lateral side surfaces of the semiconductor layered body 12. That is, hatched region in FIG. 5 shows a finished shape of the insulating film 16.

The insulating film 16 is disposed on a portion of the peripheral edge portion 12c of the n-type semiconductor layer 12n. In the case where the semiconductor layered body 12 includes the peripheral edge portion 12c, the n-side electrode 13 is in contact with and electrically connected to the n-type semiconductor layer 12n at an outer side relative to the insulating film 16 disposed on the peripheral edge portion 12c of the n-type semiconductor layer 12n. The insulating film 16 has the p-side opening 16p over the p-type semiconductor layer 12p. The p-side opening 16p is formed in a comb shape in a region where the p-side electrode 17 to be disposed. In one example, the p-side opening 16p is formed in conformity with the opening 22b of the cover electrode 15 in a plan view (see FIG. 4). The insulating film 16 further has the n-side openings 16n at the bottom of the holes 12b of the n-type semiconductor layer 12n. The n-side openings 16n are formed in, for example, a circular shape at the bottom of each of the holes 12b formed at eight positions.

In the case where the n-side openings 16n are circular, the diameter φ of the openings can be appropriately set according to the diameter of the holes 12b and within a range smaller than the diameter of the holes 12b of the n-type semiconductor layer 12n. With the diameter φ of the n-side openings 16n, for example, in a range of 3 µm to 150 µm, preferably in a range of 15 µm to 100 µm, the region where the active layer 12a etc. is removed can be reduced and the region of the p-side post electrode 3p can be increased, so that mountability can be improved.

N-Side Electrode 13 and P-Side Electrode 17

Figure 6:
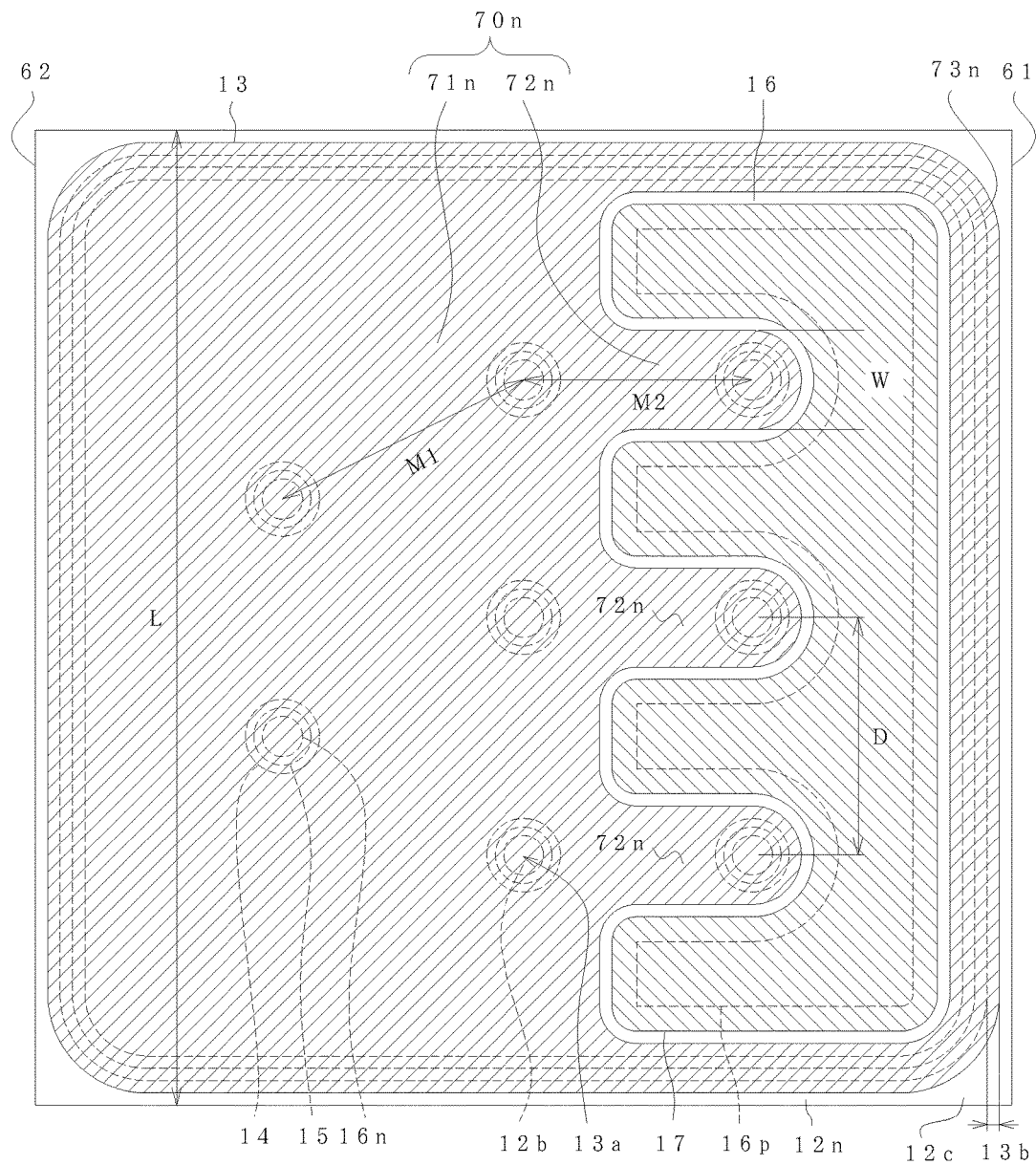
FIG. 6 is an explanatory view schematically illustrating the arrangement area of an n-side electrode and a p-side electrode of the light-emitting element in FIG. 1.

In FIG. 6, the n-side electrode 13 is shown by right-up hatching and the p-side electrode 17 is shown by right-down hatching.

The n-side electrode 13 is a pad electrode of the n-side of the light-emitting element 100. As shown in FIG. 2 and FIG. 6, the n-side electrode 13 is disposed on and extended from the insulation film 16 to the plurality of holes 12b of the n-type semiconductor layer 12n. Also, the n-side electrode 13 includes a first n-contact portion 13a that is in contact with and electrically connected to the n-type semiconductor layer 12n through the hole 12b. In the case where the semiconductor layered body 12 includes a peripheral edge portion 12c, it is preferable that the n-side electrode 13 include a second n-contact portion 13b that is disposed on and extended from the insulating film 16 and electrically connected at the peripheral edge portion 12c.

In the present embodiment, the first n-contact portions 13a are arranged at eight positions and electrically connected to the n-type semiconductor layer 12n through the n-side opening 16n of the insulating film 16. More specifically, the first n-contact portions 13a are respectively electrically connected to the n-type semiconductor layer 12n at the bottom of the holes 12 at positions of the n-side openings 16n of the insulating film 16.

The first n-contact portions 13a are arranged on a first edge side 61 and the second edge side 62 opposite to the first edge side 61 in a plan view, and a total area of the first n-contact portions 13a arranged on the second side 62 is smaller than a total area of the first n-contact portions 13a arranged on the first side 61. Generally, in the case where an electric current is supplied to a light-emitting element 100 in which a p-side post electrode 3p is disposed on the first edge 61 side and an n-side post electrode 3n is disposed on the second edge 62 side, light emission around the p-side post electrode 3p is lower than that around the n-side post electrode 3n, which may result in deviation in intensity distribution of light emission in the surface of the light-emitting element 100. In contrast, according to the present embodiment, the total area of the first n-contact portions 13a arranged at the n-side post electrode 3n side is smaller than the total area of the first n-contact portion 13a arranged in the periphery of the p-side post electrode 3p, so that the electric current supplied to the first n-contact portion 13a arranged in the periphery of the p-side post electrode 3p can be increased, compared to the electric current supplied to the first n-contact portion 13a arranged at the n-side post electrode 3n side. As a result, the deviation in intensity distribution of light emission between the first edge 61 side and the second edge 62 side of the light-emitting element 100 can be reduced, so that the intensity distribution of light emission in the surface of the light-emitting element 100 can be improved.

The number of first n-contact portions 13a arranged on the second edge 62 side is preferably fewer than the number of first n-contact portions 13a arranged on the first edge 61 side, with this, the total area of the first n-contact portions 13a on the second edge 62 side can be made smaller than the total area of the first n-contact portions 13a on the first edge 61 side. In the present embodiment, the first n-contact portions 13a are arranged at three positions on the first edge 61 side and at two positions on the second edge 62 side. In the present specification, the number of second n-contact portions 13h arranged on the first edge 61 side or on the second edge 62 side refers to the number of second n-contact portions 13h arranged on the first edge 61 side or on the second edge 62 side with respect to the center line of the semiconductor layered body 12, which is substantially parallel to the first edge 61. The number of second n-contact portions 13h disposed on the center line of the semiconductor layered body 12 is not involved.

The first n-contact portions 13a preferably have diameters such that the first n-contact portions 13a arranged at the second edge 62 side have smaller diameters than the diameters of the first n-contact portions 13a arranged at the first edge 61 side. With this, the total area of the first n-contact portions 13a arranged on the second edge 62 side can be made smaller than the total area of the first n-contact portions 13a provided on the first edge 61 side. Accordingly, the intensity distribution of light emission of the light-emitting element 100 can be improved, and also the light emission area of the light-emitting element 100 can be increased.

It is preferable that the number or the diameters of the first n-contact portions 13a arranged under the n-side post electrode 3n be changed. In other words, it is preferable that the number or the diameter of the first n-contact portions 13 arranged under the n-side post electrode 3n be changed to reduce the total area of the first n-contact portions 13a at the second edge 62 side, compared with the total area of the first n-contact portions 13a arranged at the first edge 61 side. Generally, in the case where an electric current is supplied to a light-emitting element 100 in which a p-side post electrode 3p is disposed on the first edge 61 side and an n-side post electrode 3n is disposed on the second edge 62 side, light emission around the p-side post electrode 3p is lower than that around the n-side post electrode 3n. Accordingly, the total area of the first n-contact portions 13a under the n-side post electrode 3n is reduced to reduce the deviation in intensity distribution of light emission between the first edge 61 side and the second edge 62 side, and thus, the intensity distribution of light emission in the surface of the light-emitting element 100 can be improved.

As shown in FIG. 6, in the light-emitting element 100 of the present embodiment, the first n-contact portions 13a are arranged at two positions at the second edge 62 side, at three positions on the center line in the direction parallel to the first edge 61 side of the light-emitting element 100, and at three positions at the first edge 61 side in a plan view. In this case, it is preferable that a shortest distance M1 from the first n-contact portion 13a arranged at the second edge 62 side to the first n-contact portion 13a arranged on the center line be longer than a shortest distance M2 from the first n-contact portion 13a arranged on the center line to the first n-contact portion 13a arranged at the first edge 61 side. In the present specification, the shortest distances M1 and M2 between the first n-contact portions 13a refers to a distance between the centers of two first n-contact portions 13a. With, the first n-contact portions 13a arranged as described above, supply of electric current to the periphery of the p-side post electrode 3p can be facilitated, rather than to the periphery of the n-side post electrode 3n, so that the deviation in intensity distribution of light emission between the first edge 61 side and the second edge 62 side can be reduced, and the intensity distribution of light emission in the surface of the light-emitting element 100 can be improved.

Figure 7:
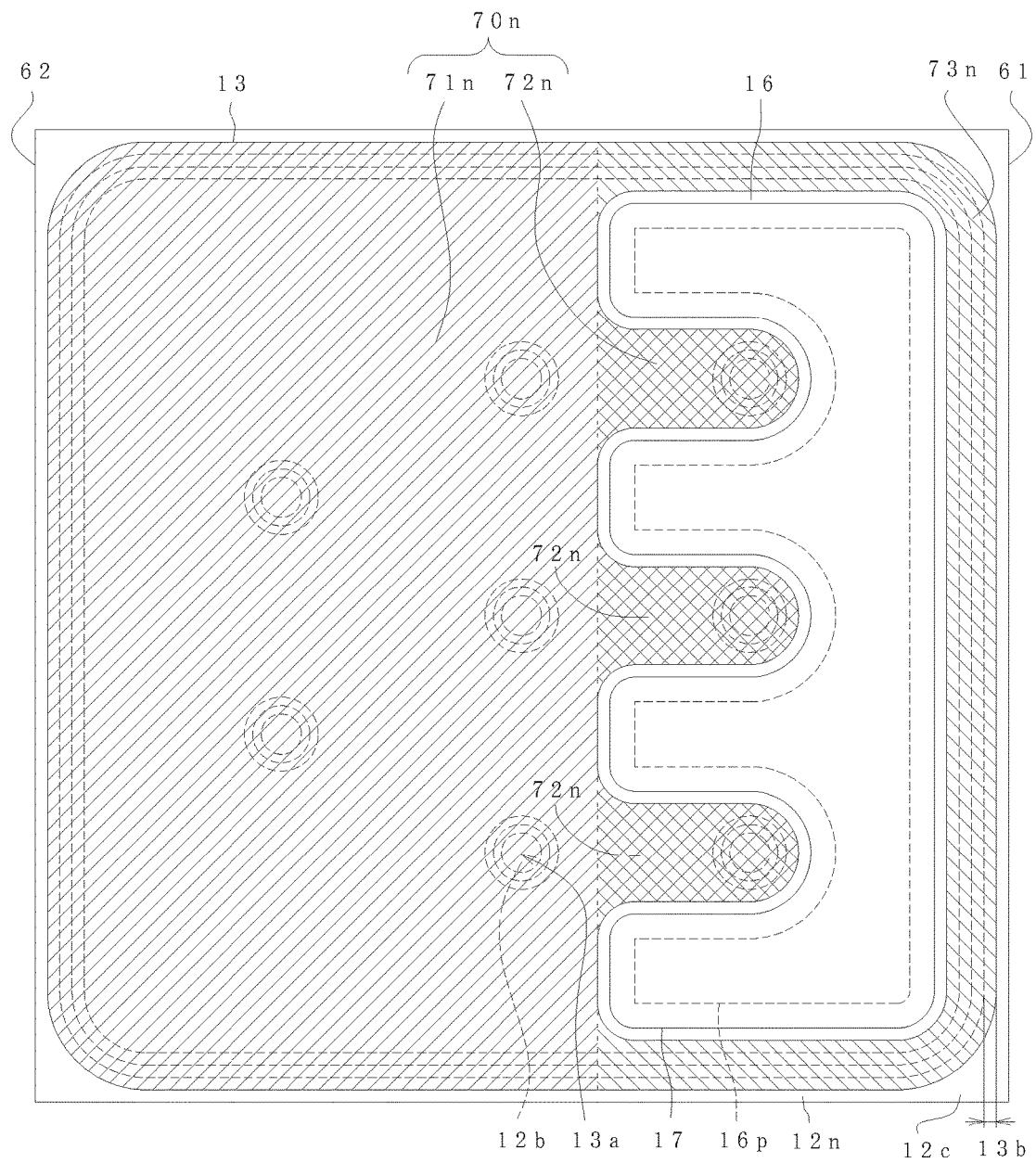
FIG. 7 is an explanatory view schematically illustrating the arrangement area of the n-side electrode of the light-emitting element in FIG. 1.

In the present embodiment, as shown in FIG. 6, the n-side electrode 13 includes an n-side comb-shaped portion 70n and a peripheral wall portion 73n. The n-side comb-shaped portion 70n includes the first n-contact portions 13a, and is disposed in a comb shape extended from a second edge 62 side towards the first edge 61 side of the semiconductor layered body 12. The peripheral wall portion 73n includes the second n-contact portion 13b and continuously extends from the n-side comb-shaped portion 70n. The peripheral wall portion 73n is formed along the first edge 61 of the semiconductor layered body 12. More specifically, as shown in FIG. 7, the region indicated by right-up hatching and regions indicated by cross-hatching are the n-side comb-shaped portion 70n, and the region indicated by right-down hatching is the peripheral wall portion 73n. The second n-contact portion 13b is formed in an approximately rectangular ring shape and arranged in contact with the peripheral edge portion 12c of the semiconductor layered body 12 formed in an approximately rectangular shape in a plan view. Accordingly, the contact area between the n-side electrode 13 and the n-type semiconductor layer 12n is increased, so that an increase in forward voltage Vf can be reduced even if the number of second n-contact portions 13a is decreased. Generally, in the case where the total area of the first n-contact portions 13a is simply reduced, the contact area between the n-side electrode 13 and the n-type semiconductor layer 12n is decreased, which leads to an increase in the forward voltage Vf. Also, the current is likely to be unevenly distributed, so that the light emitting intensity distribution on the light emitting surface of the light emitting element 1 may be deteriorated. However, in the present embodiment, the second n-contact portion 13b is provided, so that the intensity distribution of light emission in the surface of the light-emitting element 100 can be improved while an increase in the Vf can be reduced. It is noted that, in the present embodiment, the second n-contact portion 13b is disposed on the entire circumference of the semiconductor layered body 12, but a region, a part of which is not in contact with the n-type semiconductor layer 12n may exist as long as the effect of reducing the forward voltage Vf is not reduced.

The n-side comb-shaped portion 70n includes a base portion 71n and a plurality of extending portions 72n. The base portion 71n is arranged on the second edge 62 side. The base portion 71n is arranged in a region absent of the p-side post electrode 3p. In the present embodiment, the base portion 71n has a longitudinally extending approximately rectangular shape in a plan view, and the plurality of extending portions 72n are arranged on and extended from a side positioned on the first edge 61 side of the base portion 71n to the first edge 61 side. The peripheral wall portion 73n is extended from both end portions of a side positioned on the first edge 61 side of the base portion 71n, provided along the peripheral edge portion 12c of the n-type semiconductor layer 12n, connected to the n-side electrode 13 arranged along the one side 61, and provided so as to surround the p-side post electrode 3p. Also, the peripheral wall portion 73n is formed with a width smaller than the width W of the extending portions 72n. More specifically, as shown in FIG. 7, the region shown by right-up hatching is the base portion 71n, and the regions shown by right-down hatching are the plurality of extending portions 72n.

The extending portions 72n are extended from the base portion 71n to the first edge 61 side and electrically connected to the n-type semiconductor layer 12n through the first n-contact portions 13a on the first edge 61 side. The extending portions 72n are arranged so as not to overlap the p-side post electrode 3p in a plan view, and the first n-contact portions 13a are arranged on the tip end side of the extending portions 72n.

The length (hereinafter referred to as "width") of the extending portions 72n in the direction parallel to the one side 61 of the semiconductor layered body 12 can be appropriately set. As shown in FIG. 6, in the case where the width of the tip end side and the width of the base end side of the extending portions 72n are a uniform width W, the convergence of the electric current generated at the narrow sections of the extending portions 72n can be reduced, and the electric current can be efficiently supplied to the first n-contact portions 13a positioned on the tip end side of the extending portions 72n, compared with the shape in which the width on the base end side is narrow. Accordingly, it is preferable that the width W of the plurality of extending portions 72n be approximately uniform from the base end side to the tip end side so as to improve the intensity distribution of light emission in the surface of the light-emitting element 100. In contrast, in the case where the extending portions 72n are formed in a shape in which the width on the base end side is narrower than the width on the tip end side where the first n-contact portions 13a are arranged, the arrangement area of the p-side post electrode 3p can be easily expanded, so that the mountability of the light-emitting element 100 can be improved.

Thus, in the case where the width W of the plurality of extending portions 72n is approximately uniformly formed from the base end side toward the tip end side, the width W of the extending portions 72n can be in a range of $1/100$ to $1/3$ with respect to a length L in the direction parallel to the first edge side 61 of the semiconductor layered body 12, preferably, in a range of $1/50$ to $1/5$ with respect to the length L. With this, the intensity distribution of light emission in the surface of the light-emitting element 100 can be improved, and the area of the p-side post electrode 3p can be expanded, and the mountability can be improved.

It is preferable that the plurality of extending portions 72n be provided at regular intervals in the direction parallel to the first edge side 61 of the semiconductor layered body 12 in a plan view. That is, it is preferable that the distance of the intervals D between the plurality of extending portions 72n be equal. In the present specification, the intervals D between the plurality of extending portions 72n refer to a distance between the centers of the two extending portions 72n adjacent to each other. Each extending portion 72n is electrically connected to the n-type semiconductor layer 12n through each first n-contact portion 13a. With this arrangement, the electric current supplied through the n-side electrode 13 can be uniformly diffused to the n-type semiconductor layer 12n in the direction parallel to the first edge side 61 of the semiconductor layered body 12, so that the intensity distribution of light emission in the surface of the light-emitting element 100 can be improved.

As shown in FIG. 6, it is preferable that the plurality of extending portions 72n have a same shape in a plan view. With this configuration, the electric current supplied through the n-side electrode 13 can be approximately uniformly diffused to the n-type semiconductor layer 12n in the direction parallel to the first edge side 61 of the semiconductor layered body 12, so that the intensity distribution of light emission in the surface of the light-emitting element 100 can be improved. Furthermore, it is preferable that the width W of the plurality of extending portions 72n be approximately uniformly formed from the base end side to the tip end side, and respective extending portions 72n have a same shape. With this, the electric current is diffused to the entire surface of the light-emitting element, and the intensity distribution of light emission can be improved.

The p-side electrode 17 is a pad electrode on the p-side of the light-emitting element 100. As shown in FIGS. 2 and 6, the p-side electrode 17 is formed so as to extend to the p-side opening 16p and the opening 22b of the cover electrode 15 in the right-side area of FIG. 6. Also, the p-side electrode 17 is electrically connected to the whole surface electrode 14 through the p-side opening 16p and the opening 22b of the cover electrode 15 and electrically connected to the p-type semiconductor layer 12p via the whole surface electrode 14. In a plan view, the p-side electrode 17 is formed in a comb shape similar to that of the p-side opening 16p and in a size that is slightly larger than the size of the p-side opening 16p or the opening 22b of the cover electrode 15.

For the n-side electrode 13 and the p-side electrode 17, a metal material can be used. For example, a single metal such as Ag, Al, Ni, Rh, Au, Cu, Ti, Pt, Pd, Mo, Cr, or W, or an alloy mainly composed of those metals can be used. In the case of using an alloy, a non-metal element such as Si may be contained as a composition element, for example in an alloy of AlSiCu. For the n-side electrode 13 and the p-side electrode 17, a single layer or a multilayer made of the aforementioned metal materials can be used.

N-Side Post Electrode 3n and P-Side Post Electrode 3p

As shown in FIG. 1 and FIG. 2, the n-side post electrode 3n is disposed on the n-side electrode 13 and electrically connected to the n-side electrode 13. As shown in FIGS. 1 and 2, the p-side post electrode 3p is provided on the p-side electrode 17 and electrically connected to the p-side electrode 17. The n-side post electrode 3n and the p-side post electrode 3p also serve as a heat conduction path for releasing heat generated by the light-emitting element 100.

The n-side post electrode 3n is preferably formed to cover the first n-contact portions 13a. Specifically, it is preferable that the first n-contact portions 13a arranged on the second edge 62 side be covered with the n-side post electrode 3n, and the first n-contact portions 13a be arranged under the n-side post electrode 3n in a plan view. Accordingly, electrons supplied to the n-side post electrode 3n can be efficiently supplied to the first n-contact portions 13a.

For the materials of the n-side post electrode 3n and the p-side post electrode 3p, metal such as Cu, Au, and Ni can be used. The n-side post electrode 3n and the p-side post electrode 3p can be formed by using an electroplating method.

At the time of the mounting, a bonding member is applied between the n-side post electrode 3n and an external wiring pattern, and between the p-side post electrode 3p and an external wiring pattern. After the bonding member is melted and subsequently cooled, thus, the n-side post electrode 3n and the p-side post electrode 3p are firmly bonded with the external wiring patterns. For the bonding member, solder of Sn—Au, Sn—Cu, Sn—Sg—Cu, or the like can be used. In this case, the uppermost layers of the n-side post electrode 3n and the p-side post electrode 3p are preferably made of materials having good adhesion with the bonding member to be used.

As described above, the light-emitting element 100 according to the present embodiment includes the plurality of first n-contact portions 13a arranged so as to contact the n-side electrode 13 with the bottom surface of the holes 12b of the n-type semiconductor layer 12n. Also, the light-emitting element 100 includes the p-side post electrode 3p on the first edge 61 side and the n-side post electrode 3n on the second edge 62 side, and the total area of the first n-contact portion 13a arranged on the second edge 62 side is smaller than the total area of the first n-contact portion 13a arranged on the first edge 61 side. Thus, the first n-contact portions 13a are arranged, so that the deviation in intensity distribution of light emission can be improved on the first edge 61 side and on the second side 62 side, and the intensity distribution of light emission of the light-emitting element 100 can be improved. Furthermore, the n-side electrode 13 includes the second n-contact portion 13b arranged so as to contact the peripheral edge portion 12c of the semiconductor layered body 12 formed in an approximately rectangular shape in a plan view, so that an increase in the forward voltage Vf of the light-emitting element 100 can be reduced, and the output of the light emission can be improved. Accordingly, the light-emitting element 100 can improve the intensity distribution of light emission in the surface of the light-emitting element 100 while reducing an increase in the forward voltage Vf of the light-emitting element 100.

Second Embodiment

Figure 8:
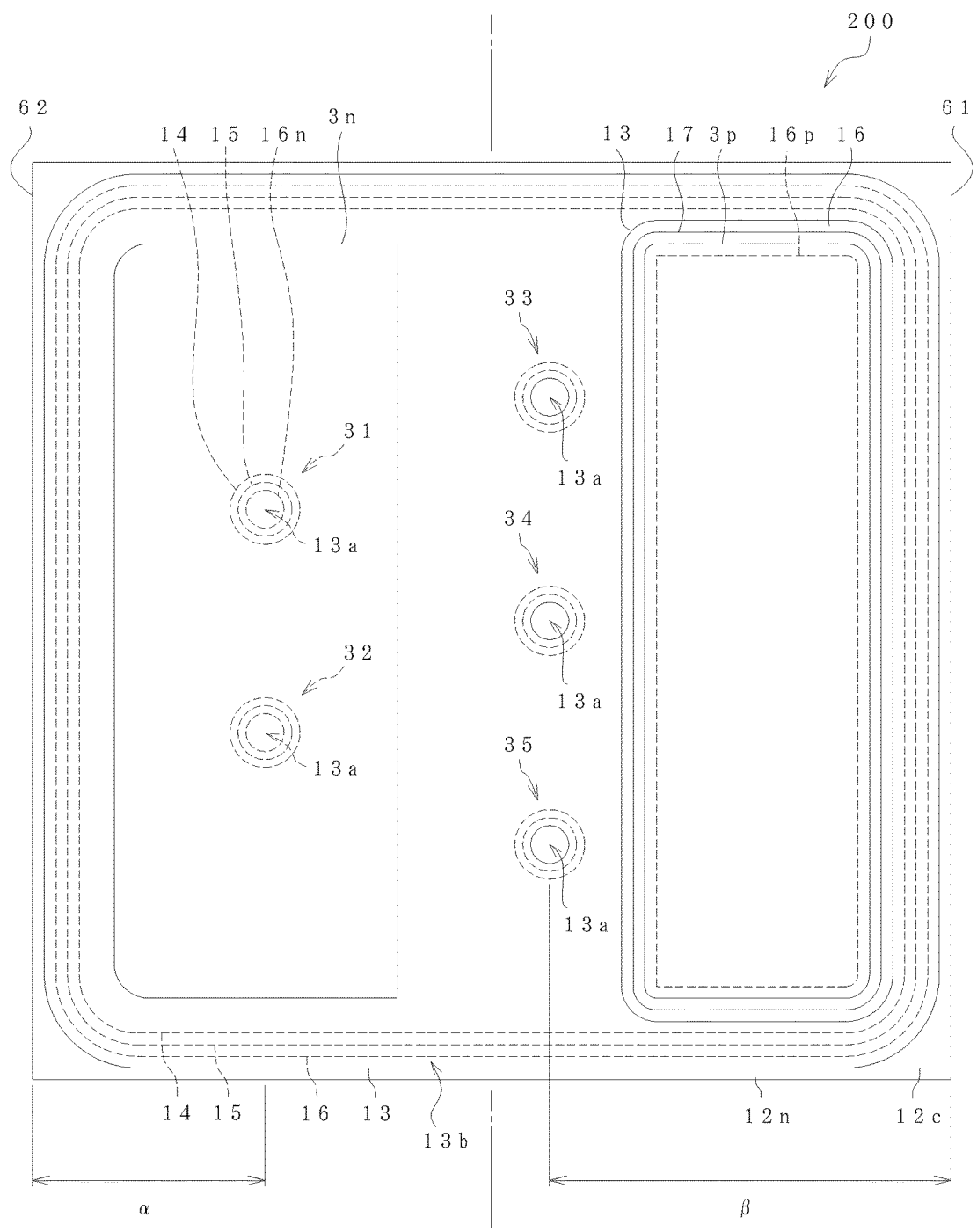
FIG. 8 is a plan view schematically illustrating the configuration of the light-emitting element according to a second embodiment of the present invention.

As shown in FIG. 8, a light-emitting element 200 according to a second embodiment is different from the light-emitting element 100 according to the first embodiment in terms of the arrangement of the n-side electrode 13 and the shape of the p-side electrode 17. Hereinafter, the same reference numerals will be applied to the configurations that are the same or similar to those of the light-emitting element 100 shown in FIG. 1 and description thereof will be appropriately omitted.

The light-emitting element 200 includes, in a plan view, a p-side post electrode 3p on the first edge 61 side of a semiconductor layered body 12, and an n-side post electrode 3n on the second edge 62 side opposite to the first edge 61 side. Further, in the light-emitting element 200, a plurality of first n-contact portions 13a are arranged only on the second edge 62 side in a plan view.

In the example shown in FIG. 8, a total of five first n-contact portions 13a are arranged in two rows in a direction substantially parallel to the first edge 61 of the semiconductor layered body 12. More specifically, in the first row, two first n-contact portions 13a are arranged on the second edge 62 side with respect to the center line shown in FIG. 8. In the present embodiment, the two first n-contact portions 13a are referred to as inner-peripheral N-contacts 31 and 32. In the second row, three first n-contact portions 13a are arranged near the center line shown in FIG. 8. In the present embodiment, the three first n-contact portions 13a are referred to as inner-peripheral N-contacts 33, 34, and 35. In the light-emitting element 200, in a plan view, a plurality of second n-contact portions 13h are arranged so as to satisfy the inequality $\beta > \alpha$, where $\alpha$ is a distance between the inner-peripheral N-contacts 31, 32, and 33 and the second edge 62 of the semiconductor layered body 12, and $\beta$ is a distance between the inner-peripheral N-contacts 34, 35, and 36 and the first edge 61 of the semiconductor layered body. The two first n-contact portions 13a are arranged on the first edge 61 side, and the three first n-contact portions 13a are arranged on the second edge 62 side, and therefore the number of first n-contact portions 13a on the first edge 61 side is less than the number of first n-contact portions 13a on the second edge 62 side.

In the light-emitting element 200, in a plan view, the whole of the p-side post electrode 3p is arranged between the first n-contact portion 13a arranged nearest to the first edge 61 side, out of all the first n-contact portions 13a, and the peripheral edge portion 12c of the n-type semiconductor layer 12n arranged on the first edge 61 side. In the example shown in FIG. 8, the whole of the p-side post electrode 3p is arranged between the inner-peripheral N-contacts 33, 34, and 35 and the first edge 61 of the semiconductor layered body 12.

In the light-emitting element 200, the p-side post electrode 3p is formed in an approximately rectangular shape in a plan view, and the n-side electrode 13 is arranged so as to surround the periphery of the p-side electrode 17. Further, the n-side electrode 13 includes the first n-contact portion 13a arranged so as to contact the n-type semiconductor layer 12n through the n-side openings 16n and the second n-contact portion 13b arranged so as to contact the peripheral edge portion 12c of the semiconductor layered body 12 formed in an approximately rectangular shape.

In the light-emitting element 200 according to the present embodiment, the number of first n-contact portions 13a on the second edge 62 side is less than the number of first n-contact portions 13a on the first edge 61 side, so that the deviation in intensity distribution of light emission can be improved in the periphery of the n-side post electrode 3n and in the periphery of the p-side post electrode 3p, and the intensity distribution of light emission can be improved.

Furthermore, the n-side electrode 13 includes the second n-contact portion 13b, so that an increase in the forward voltage Vf of the light-emitting element 200 can be reduced. Accordingly, the light-emitting element 200 can improve the intensity distribution of light emission in the surface of the light-emitting element 200 while reducing an increase in the forward voltage Vf. Also, in the light-emitting element 200, in a plan view, the plurality of first n-contact portions 13a are arranged closer side (the left side in FIG. 8) to the n-side post electrode 3n, so that the area for the p-side post electrode 3p formed in an approximately rectangular shape can be expanded. Thus, mountability can be improved while maintaining the intensity distribution of light emission in the surface of the light-emitting element 200.

As described above, the light-emitting element according to the present invention has been specifically described based on the embodiments of the present invention. However, the gist of the present invention is not limited to the descriptions but needs to be interpreted broadly based on Claims. Also, needless to say, the gist of the present invention includes various changes and modifications based on the descriptions.

What is claimed is:

1. A light-emitting element comprising:
   a semiconductor layered body having a polygonal shape in a plan view and comprising:
     an n-type semiconductor layer, and
     p-type semiconductor layer disposed on a portion of the n-type semiconductor layer;
   an insulating film disposed on the semiconductor layered body and defining at least one p-side opening above the p-type semiconductor layer and a plurality of n-side openings exposing the n-type semiconductor layer;
   an n-side electrode disposed on the insulating film and comprising a plurality of first n-contact portions each electrically connected to the n-type semiconductor layer through one of the plurality of n-side openings;
   a p-side electrode electrically connected to the p-type semiconductor layer through the at least one p-side opening;
   a p-side post electrode disposed on the p-side electrode; and
   an n-side post electrode disposed on the n-side electrode,
   wherein, in the plan view, (i) the p-side electrode and one or more of the first n-contact portions are located on a first side of the semiconductor layered body, and (ii) the n-side electrode and one or more of the first n-contact portions are located on a second side of the semiconductor layered body, and
   wherein a total area of the one or more first n-contact portions located on the second side is smaller than a total area of the one or more first n-contact portion located on the first side.

2. The light-emitting element according to claim 1, wherein the p-type semiconductor layer is disposed on a portion within a region that is interior to a peripheral edge portion, and the n-side electrode includes a second n-contact portion disposed on the insulating film and extended so as to be electrically connected to the n-type semiconductor layer on the peripheral edge portion.

3. The light-emitting element according to claim 2, wherein the semiconductor layered body has a substantially rectangular shape or a substantially hexagonal shape in a plan view.

4. The light-emitting element according to claim 3, wherein at least one of the one or more first n-contact portions located on the second side is disposed under the n-side post electrode, and a number of the first n-contact portions disposed under the n-side post electrode is less than a number of the one or more first n-contact portions located on the first side.

5. The light-emitting element according to claim 3, wherein the second n-contact portion is formed in a substantially rectangular ring shape.

6. The light-emitting element according to claim 2, wherein at least one of the one or more first n-contact portions located on the second side is disposed under the n-side post electrode, and a number of the first n-contact portions disposed under the n-side post electrode is less than a number of the one or more first n-contact portions located on the first side.

7. The light-emitting element according to claim 6, wherein the second n-contact portion is formed in a substantially rectangular ring shape.

8. The light-emitting element according to claim 2, wherein at least one of the one or more first n-contact portions located on the second side is disposed under the n-side post electrode, and a diameter of the one or more first n-contact portions disposed under the n-side post electrode is smaller than a diameter of the one or more first n-contact portions located on the first side.

9. The light-emitting element according to claim 2, wherein the first n-contact portions have a diameter in a range of 3 μm to 150 μm.

10. The light-emitting element according to claim 2, wherein the second n-contact portion is formed in a substantially rectangular ring shape.

11. The light-emitting element according to claim 2, wherein two or more of the first n-contact portions are located on the first side, and two or more of the first n-contact portions are located on the second side.

12. The light-emitting element according to claim 1, wherein the semiconductor layered body has a substantially rectangular shape or a substantially hexagonal shape in a plan view.

13. The light-emitting element according to claim 12, wherein at least one of the one or more first n-contact portions located on the second side is disposed under the n-side post electrode, and a number of the first n-contact portions disposed under the n-side post electrode is less than a number of the one or more first n-contact portions located on the first side.

14. The light-emitting element according to claim 12, wherein at least one of the one or more first n-contact portions located on the second side is disposed under the n-side post electrode, and a diameter of the one or more first n-contact portions disposed under the n-side post electrode is smaller than a diameter of the one or more first n-contact portions located on the first side.

15. The light-emitting element according to claim 12, wherein the first n-contact portions have a diameter in a range of 3 μm to 150 μm.

16. The light-emitting element according to claim 12, wherein two or more of the first n-contact portions are located on the first side, and two or more of the first n-contact portions are located on the second side.

17. The light-emitting element according to claim 1, wherein at least one of the one or more first n-contact portions located on the second side is disposed under the n-side post electrode, and a number of the first n-contact portions disposed under the n-side post electrode is less than a number of the one or more first n-contact portions located on the first side.

18. The light-emitting element according to claim 1, wherein at least one of the one or more first n-contact portions located on the second side is disposed under the n-side post electrode, and a diameter of the one or more first n-contact portions disposed under the n-side post electrode is smaller than a diameter of the one or more first n-contact portions located on the first side.

19. The light-emitting element according to claim 1, wherein the first n-contact portions have a diameter in a range of 3 μm to 150 μm.

20. The light-emitting element according to claim 1, wherein two or more of the first n-contact portions are located on the first side, and two or more of the first n-contact portions are located on the second side.

* * * * *